United States Patent
Bergveld et al.

(10) Patent No.: US 7,321,750 B2
(45) Date of Patent: Jan. 22, 2008

(54) COMMUNICATION SYSTEM, DEVICE AND METHOD

(75) Inventors: Hendrik J. Bergveld, Eindhoven (NL); Franciscus A. C. M. Schoofs, Eindhoven (NL)

(73) Assignee: NXP B.V., Eindhoven (NL)

( * ) Notice: Subject to any disclaimer, the term of this patent is extended or adjusted under 35 U.S.C. 154(b) by 125 days.

(21) Appl. No.: 09/840,819

(22) Filed: Apr. 24, 2001

(65) Prior Publication Data

US 2001/0014613 A1 Aug. 16, 2001

Related U.S. Application Data

(63) Continuation of application No. 09/207,528, filed on Dec. 8, 1998.

(30) Foreign Application Priority Data

Dec. 12, 1997 (EP) .................. 97203902

(51) Int. Cl.
*H01Q 11/12* (2006.01)
*H04B 1/04* (2006.01)

(52) U.S. Cl. .................. 455/91; 455/126; 455/127.1; 455/572; 330/297

(58) Field of Classification Search ............... 455/507, 455/517, 522, 64, 115, 67.1, 343, 126–127.5, 455/572–574; 456/127.1, 127.5; 330/297
See application file for complete search history.

(56) References Cited

U.S. PATENT DOCUMENTS 5,265,119 A * 11/1993 Gilhousen et al. .......... 370/335
5,276,912 A * 1/1994 Siwiak et al. .................. 455/73
5,289,524 A * 2/1994 Takano et al. ............. 340/7.28
5,590,419 A * 12/1996 Shimo ..................... 455/127.2
5,603,106 A * 2/1997 Toda ........................... 455/126
5,774,797 A * 6/1998 Kawano et al. .......... 455/127.2
5,826,170 A * 10/1998 Hirschfield et al. ........ 455/13.4
5,943,610 A * 8/1999 Endo ........................... 455/69
6,067,458 A * 5/2000 Chen .......................... 455/522
6,335,923 B2 * 1/2002 Kubo et al. ................. 370/335

* cited by examiner

*Primary Examiner*—Simon Nguyen

(57) ABSTRACT

A communication system such as a telephone system has at least a base station and a communication device to communicate with the base station, the communication device comprises an RF power amplifier having an RF output for coupling to an antenna and an RF output power control input, a power supply having a power supply terminal, a control input and a supply output coupled to the RF output power control input for controlling an RF output power on the RF output in dependence on a signal on the control input of the power supply, a data receiver means for coupling to the antenna, the data receiver means having a data output for providing data received from the base station which represents information about said RF output power, and a table means containing a listing of possible power supply control input values related to possible RF output power values, the table means having a table selection input coupled to the data output of the data receiver means and a table output coupled to the control input of the power supply for using said RF output power related information to select that power supply control input value in the table means which corresponds to a desired RF output power value.

18 Claims, 2 Drawing Sheets

COMMUNICATION SYSTEM, DEVICE AND METHOD

CROSS REFERENCE TO RELATED APPLICATIONS

This is a continuation divisional of application Ser. No. 09/207,528, filed Dec. 8, 1998.

The present invention relates to a communication system and a communication method.

The present invention further relates to a communication device outlined in the preamble of claim 9, which is suitable for application in the communication system and to the communication method.

Such a communication system and device are known from U.S. Pat. No. 5,251,331 disclosing in particular a communication system such as a cellular radio system, provided with communication devices embodied as radio telephones containing a dual mode RF power amplifier and a two-level output power supply coupled to the RF power amplifier. The power supply output provided shows voltages V1 and V2 depends on the types of respective modes the system operates in. The modes include the digital mode and the analog mode which possess different demands on the supply voltage control for the RF power amplifier when it comes to maintaining an acceptable level of the efficiency of the RF power amplifier.

It is a disadvantage of the known communication system, communication device and method that they do not provide adequate flexibility, as to efficient adjustment concepts of the power dissipation in an RF power amplifier included especially in a portable/mobile communication environment.

It is an object of the present invention to provide a communication device with reduced power consumption, not having the above drawbacks.

To this end a communication system and a communication device according to the invention have certain characterizing features It is an advantage of the communication system according to the invention that within the notion of applying table means in order to adjust the RF output power the communication device may use several possible control loop concepts for communication with the base station, which concepts are applicable in order to reduce the power consumption in an RF power amplifier during transmit sessions. Also hardware architectural simplifications are principally within reach, which reduces the power consumption even further such that the discharge time of a battery included in portable/mobile devices may be increased or its required capacity/size may be reduced.

The listed data in the table means containing the relation between possible power supply control input values for the power supply and possible RF output power values can now at wish without any waste or surplus of RF output power be adjusted upon manufacturing to the particulars of the circuitry used in the type of communication device. It is to be noted that the power supply output can either contain a power supply current, or a power supply voltage which will generally be the case.

In an embodiment of a communication system according to the invention additional variables such as the working frequency of the RF output signal, and/or temperature parameters may be included as additional variables for fine tuning the required RF output power, in particular the output voltage, for providing an RF output signal of the RF power amplifier with the desired magnitude and frequency.

Preferably the table means comprise easy to implement and handle, relatively cheap memory means.

Furthermore, three possible further embodiments are described in greater detail. In first and second possible embodiments comparator means for comparing information about a desired RF output value to the actual RF output value is included in the communication device, whereas in a third embodiment this comparator means can even be dispensed with from the communication device(s).

An embodiment of the communication system according to the invention provides switching of the RF output power to maximum RF output power substantially without any loss in efficiency.

In applications wherein the RF power of the RF power output is adjusted by controlling the supply voltage to the RF power amplifier an efficient DC/DC voltage converter is preferred.

Consequently the method according to the present invention referred to above has certain advantageous characterizing features.

At present the communication system, communication device and method according to the invention will be elucidated further together with its additional advantages while reference is being made to the appended drawing, wherein similar components are being referred to by means of the same reference numerals. In the drawing.

Figure 1:
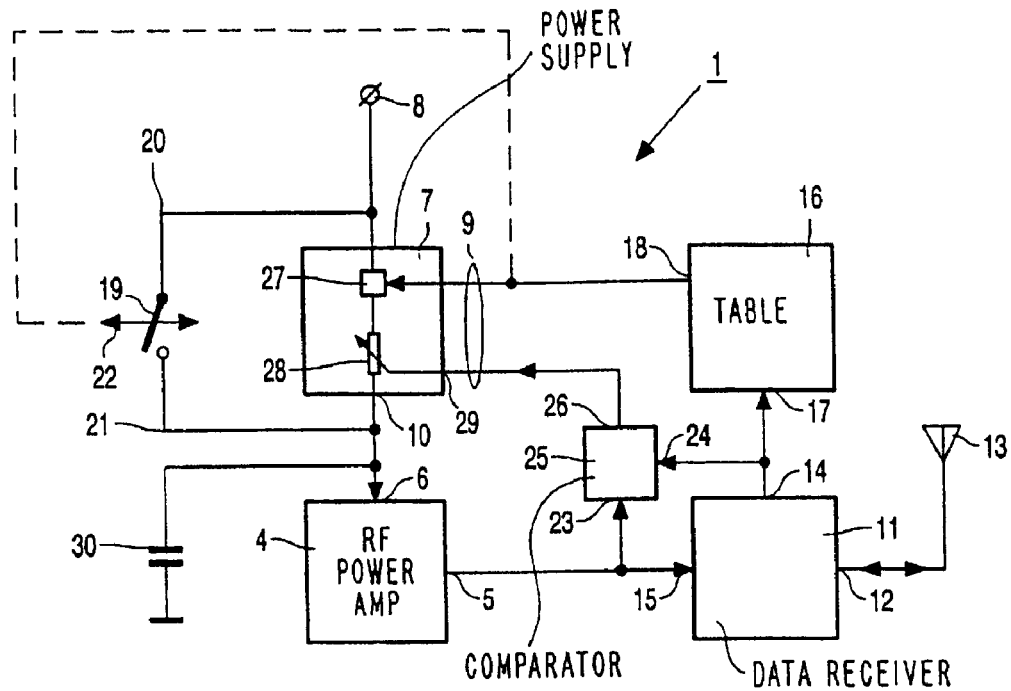
FIG. 1 shows a first possible embodiment of a communication device according to the invention.
Figure 2:
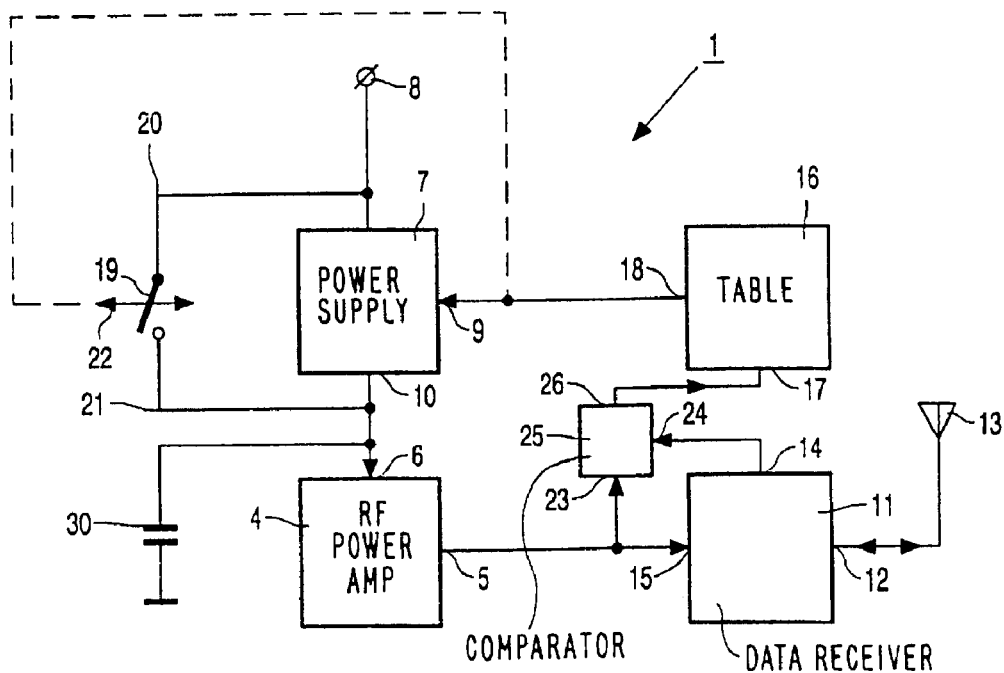
FIG. 2 shows a second possible embodiment of a communication device according to the invention.
Figure 3:
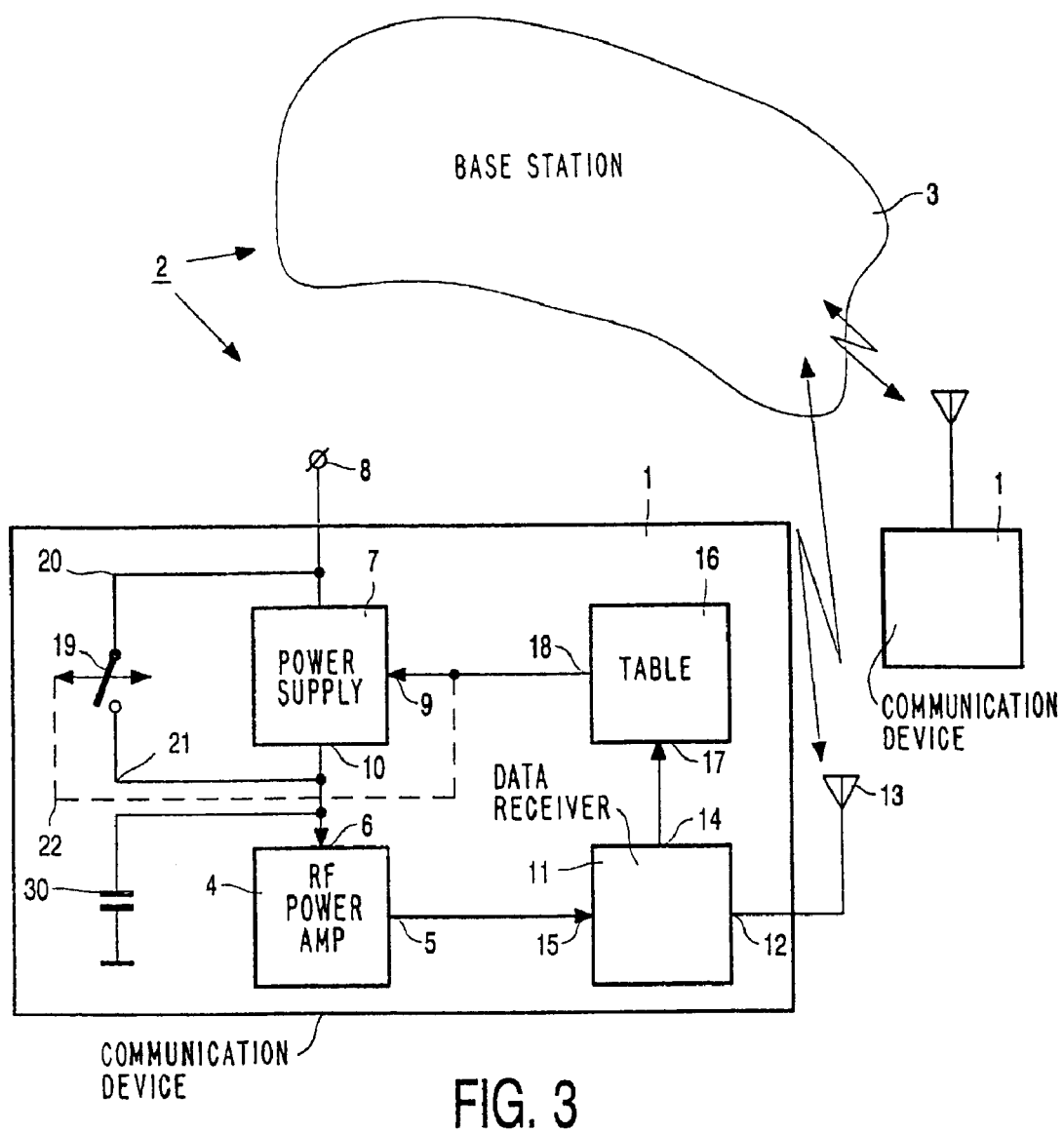
FIG. 3 shows a third possible embodiment of the communication device according to the invention applied in a communication system according to the invention.

FIGS. 1, 2 and 3 each show different embodiments of a communication device 1, which may be used in a communication system 2 schematically shown in FIG. 3, together with other similar communication devices 1. The communication system 2 further comprises a base station 3 embodied to communicate with the communication device(s) 1 and vice versa. Such communication devices 1 are being used in mobile/portable communication devices in transceivers, pagers with acknowledgement of receipt, and the like and in for example telephone systems or the like.

The communication device 1 comprises an RF power amplifier 4 having an RF output 5 and an RF power control input 6 for controlling the magnitude or value of the RF output power on the RF output 5. The controlling of the RF output power may take place by any suitable means such as for example by controlling of the duty cycle (on/off periods) or by controlling of the supply current or supply voltage of the RF power amplifier 4, schematically depicted at 28 in the RF power amplifier 4. Description of the latter case will be adhered to in the remaining of the description. In a practical implementation of the communication device 1 (not shown) the RF power amplifier 4 may have a power supply input which is separate from the RF power control input 6.

The communication device 1 also comprises a power supply 7, which may be embodied as a power supply converter for converting one power supply signal to another. The power supply 7 having a power supply terminal 8 in this case provided with a supply voltage, a control input 9 and a supply output 10 connected to the RF output power control input 6 of the RF power amplifier 4; a data receiver means 11 having an output 12 connected to an receive/transmit antenna 13, an data output 14 for providing analog or digital baseband data sent by the base station 3 and an RF input 15 connected to the RF output 5 of the RF power amplifier 4; and table means 16 generally embodied as memory means having a table selection input 17 connected to the data output 14 of the data receiver means 11 and a table output 18 connected to the control input 9 of the power supply 7. The communication device 1 may comprise a controllable switch 19 having two switch sides 20 and 21 connected to the power supply terminal 8 and the supply output 10 respectively, and a control input 22 coupled (see dotted lines in FIGS. 1-3) to the data output 14 of the receiver means 11 in the embodiments shown in the figures through table output 18.

The receiver means 11 comprises for example simplex- or duplex-, filter-, and demodulation means for performing a one-way or two-way communication link between the base station 3 and the communication device 1. The RF power of the RF power signal sent through the antenna 13 to the base station 3 is controlled in this case by controlling the supply voltage applied on RF output control input 6. One of the data sent by the base station 3 to the communication device 1 contains apart from for example speech information about the RF output power of the output power amplifier sensed in the base station 3. For the embodiments of FIGS. 1 and 2 this information concerns data about a desired signal magnitude or value of the RF output power value. This data is fed back to the communication device 1 and is available at data output 14, generally as baseband analog or digital data. On RF output 5 the actual RF output power value is available. Both values, that is the desired and the actual RF output power are input at respective comparator inputs 23 and 24 of a comparator means 25. The comparator means 25 has a comparator output 26 which is coupled to the control input 6 through control input 9. The table means 16 contain a listing of possible control input values which are related to possible RF output power values. The data at data output 14 is being used for selection of the proper control input value such that a desired RF output power value is set. Several architectural concepts are possible within this context.

In the embodiment of FIG. 1 the control input value selected from the table means 16 and available at table output 18 drives a schematically shown efficient DC/DC converter 27. This also holds for the embodiments in FIGS. 2 and 3. In the embodiment of FIG. 1 the power supply 7 is schematically shown to comprises a kind of dissipative regulator means 28 indicated as a variable resistor in power supply 7 in FIG. 1. Herein the power supply 7 is shown to have an additional control input 29 connected to the comparator output 26. A coarse RF output power control is achieved by the table output control signal on output 18, whereas a fine tuning thereof takes place based on an error signal on output 26 resulting from the difference between the desired an the actual values of the RF output power on inputs 23 and 24.

In the embodiment of FIG. 2 this error signal is being fed directly to table selection input 17 to be used as a selection signal for selecting the appropriate control input signal for controlling the RF output power. However in the embodiment of FIG. 3 the communication device does not contain any comparator means at all because the error signal is now being provided by the base station 3, sent to the communication device 1 to be available on data output 14 and table selection input 17 directly. Off course the communication protocol must be designed accordingly to cope with this new concept. However it is easier to provide some kind of hardware or software implemented comparison between an actual and a desired RF output power centrally in the base station 3 for every communication link with a communication device 1 then to do this in each and every separate communication device. Furthermore this option reduces the power consumption and hardware cost in every communication device of the communication system still further, because it does not contain the comparator means 25.

In the embodiments shown the communication device 1 has the switching means 19 which will be closed if the data on data output 14 indicates that it is desired that the RF output power is to be maximised for efficiency reasons.

In those cases wherein the RF power amplifier works in a burst mode such as in GSM communication systems it is preferred to connect a capacitor 30 to supply output 10 in order to reduce a ripple on the voltage supplied caused by the burst. Several modifications are within reach of the man skilled in the art such as the inclusion of the fine tuning in the embodiment of FIG. 1 in the embodiments of FIGS. 2 or 3. Another modification concerns a possible direct connection between table output 18 and RF control input 6, if desired.

In view of the foregoing it will be evident to a person skilled in the art that various modifications may be made within the spirit and the scope of the present invention as hereinafter defined by the appended claims and that the present invention is thus not limited to the examples provided.

The invention claimed is:

1. A communication system, comprising:
 a base station; and
 a communication device for communicating with said base station, said communication device including:
 an amplifier which outputs an RF signal having a frequency;
 a DC/DC converter connected to a power supply and adapted to provide a voltage to the amplifier to vary a power of the signal, the DC/DC converter is exclusively controlled in dependence of said frequency to vary the voltage provided by the amplifier; and
 a controllable switch connected to the power supply and the amplifier to directly connect the power supply to the amplifier.

2. The communication system of claim 1, wherein said communication device includes a memory which stores data for controlling said power.

3. The communication system of claim 1, further comprising a comparator for comparing a level of said RF signal with a desired signal level, said comparator being connected to an output of said amplifier to receive said RF signal from said amplifier.

4. The communication system of claim 3, wherein said desired signal level is provided by said base station.

5. The system of claim 3, wherein the communication device further includes a dissipative regulator means adapted to receive an output of the comparator and to fine-tune the voltage provided from the DC/DC converter to the amplifier in response to the output of the comparator, said dissipative regulator means including a variable resistor.

6. The system of claim 1, wherein the voltage provided by the DC/DC converter to the amplifier is a supply voltage for the amplifier and wherein the communication device further includes a capacitor connected between a line carrying the voltage to the amplifier, and ground.

7. A communication system, comprising:
 an amplifier which outputs an RF signal having a frequency;
 a DC/DC converter connected to a power supply and adapted to provide a voltage to the amplifier to vary a power of the RF signal, the DC/DC converter having a control input adapted to receive a control input value; and a controllable switch connected to the power supply and the amplifier to directly connect the power supply to the amplifier, wherein the control input value applied to the DC/DC converter is exclusively controlled in dependence of said frequency to vary the voltage provided to the amplifier.

8. The communication device of claim 7, further comprising memory which stores data for controlling said power.

9. The communication device of claim 7, further comprising a comparator for comparing a level of said RF signal with a desired signal level, said comparator being connected to an output of said amplifier to receive said RF signal from said amplifier.

10. The communication device of claim 9, wherein said desired signal level is provided by a communication apparatus that communicates with said communication device.

11. The communication device of claim 9, wherein the communication device further includes a dissipative regulator means adapted to receive an output of the comparator and to fine-tune the voltage provided from the DC/DC converter to the amplifier in response to the output of the comparator.

12. The communication device of claim 7, wherein the voltage provided by the DC/DC converter to the amplifier is a supply voltage for the amplifier and wherein the communication device further includes a capacitor connected between a line carrying the voltage to the amplifier, and ground.

13. A method for controlling a power of a communication device comprising:

amplifying signal to output an RF signal having a frequency using an amplifier;

varying a power of the RF output signal in dependence of said frequency by controlling a DC/DC converter connected to a power supply and adapted to provide a voltage to the amplifier and having a control input adapted to receive a control input value, the control input value being exclusively controlled in dependence of said frequency to vary the voltage provided to the amplifier; and maximizing the power of the RF signal by directly connecting the amplifier to the power supply using a controllable switch connected to the power supply and the amplifier.

14. The method of claim 13, further comprising storing data for controlling said power in a memory.

15. The method of claim 13, further comprising comparing a level of said RF output signal with a desired signal level.

16. The method of claim 15, further comprising providing said desired signal level by a communication apparatus that communicates with said communication device.

17. The method of claim 15, further comprising fine-tuning the voltage provided from the DC/DC converter to the amplifier in response to the output of the comparison.

18. The method of claim 13, further comprising filtering ripple from the voltage provided from the DC/DC converter to the amplifier by means of a capacitor connected between a line carrying the voltage to the amplifier, and ground.

* * * * *